United States Patent
Nguyen et al.

(10) Patent No.: US 7,242,045 B2
(45) Date of Patent: Jul. 10, 2007

(54) SPIN TRANSFER MAGNETIC ELEMENT HAVING LOW SATURATION MAGNETIZATION FREE LAYERS

(75) Inventors: Paul P. Nguyen, San Jose, CA (US); Yiming Huai, Pleasanton, CA (US); Zhitao Diao, Fremont, CA (US); Frank Albert, Redwood City, CA (US)

(73) Assignee: Grandis, Inc., Milpitas, CA (US)

( * ) Notice: Subject to any disclaimer, the term of this patent is extended or adjusted under 35 U.S.C. 154(b) by 190 days.

(21) Appl. No.: 10/783,416

(22) Filed: Feb. 19, 2004

(65) Prior Publication Data

US 2005/0184839 A1 Aug. 25, 2005

(51) Int. Cl.
   *H01L 29/76* (2006.01)
(52) U.S. Cl. ................ 257/295; 257/204
(58) Field of Classification Search ........ 257/295, 257/204
   See application file for complete search history.

(56) References Cited

U.S. PATENT DOCUMENTS

| | | | |
|---|---|---|---|
| 6,381,106 B1* | 4/2002 | Pinarbasi | 360/324.12 |
| 6,532,164 B2 | 3/2003 | Redon et al. | |
| 6,781,872 B2* | 8/2004 | Saito et al. | 365/158 |
| 2002/0105827 A1 | 8/2002 | Redon et al. | |
| 2003/0007398 A1 | 1/2003 | Daughton et al. | |
| 2003/0059588 A1 | 3/2003 | Hannah et al. | |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809-3811.

J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

Daughton, et al., Patent Publication US2003/0007398 filed Jan. 9, 2003 Figures 3, 4, 5A; Paragraphs 60, 61, 67,68.

(Continued)

*Primary Examiner*—Douglas M. Menz
(74) *Attorney, Agent, or Firm*—Strategic Patent Group, P.C.

(57) ABSTRACT

A method and system for providing a magnetic element that can be used in a magnetic memory is disclosed. The magnetic element includes pinned, nonmagnetic spacer, and free layers. The spacer layer resides between the pinned and free layers. The free layer can be switched using spin transfer when a write current is passed through the magnetic element. The magnetic element may also include a barrier layer, a second pinned layer. Alternatively, second pinned and second spacer layers and a second free layer magnetostatically coupled to the free layer are included. In one aspect, the free layer(s) include ferromagnetic material(s) diluted with nonmagnetic material(s) and/or ferrimagnetically doped to provide low saturation magnetization(s).

46 Claims, 9 Drawing Sheets

OTHER PUBLICATIONS

Naoki Nishimura, et al., *Magnetic tunnel junction device with perpendicular magnetization films for high-density magnetic random access memory*, Journal of Applied Physics, vol. 91, No. 8, Apr. 2002, pp. 5246-5249.

L. Berger, *Emission of spin waves by a magnetic multilayer traversed by a current*, Physical Review B, vol. 54, No. 13, Oct. 1996, pp. 9353-9358.

William Bailey, et al., *Control of Magnetization Dynamics in $Ni_{81}Fe_{19}$ Thin Films Through the Use of Rare-Earth Dopants*, IEEE Transactions on Magnetics, vol. 37, No. 4, Jul. 2001, pp. 1749-1754.

\* cited by examiner

SPIN TRANSFER MAGNETIC ELEMENT HAVING LOW SATURATION MAGNETIZATION FREE LAYERS

FIELD OF THE INVENTION

The present invention relates to magnetic memory systems, and more particularly to a method and system for providing a magnetic element that employs a spin transfer effect in switching, and that can be switched using a lower switching current density.

BACKGROUND OF THE INVENTION

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional conductive spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional conductive spacer layer 16 is nonmagnetic. The AFM layer 12 is used to fix, or pin, the magnetization of the pinned layer 14 in a particular direction. The magnetization of the free layer 18 is free to rotate, typically in response to an external magnetic field. Also depicted are top contact 20 and bottom contact 22 that can be used to drive current through the conventional magnetic element 10. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high. To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B).

In order to overcome certain issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett.*, vol. 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$-$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer functions as a mechanism for switching the conventional magnetic elements 10 and 10', one of ordinary skill in the art will readily recognize that a high current density is typically required to induce switching for the conventional magnetic elements 10 and 10'. In particular, the switching current density is on the order of a few $10^7$ A/cm$^2$ or greater. Thus, a high write current is used to obtain the high switching current density. The high operating current leads to design problems for high density MRAM, such as heating, high power consumption, large transistor size, as well as other issues. Moreover, if a spin valve such as the conventional element 10 is used, the output signal is small. In the conventional magnetic element 10, both the total resistance and the change in resistance in SV-based spin transfer elements are small typically less than two Ohms and five percent, respectively.

One proposed method of increasing the output signal is to use a spin tunneling junction, such as the conventional magnetic element 10', for the spin transfer device. The conventional magnetic element 10' can exhibit large resistance and large signal. For example, resistances can be in excess of one thousand Ohms and resistance changes can be a greater than forty percent. However, one of ordinary skill in the art will readily recognize that the use of the conventional magnetic element 10' requires a small operating current to keep the conventional magnetic element 10' from deteriorating or breaking down.

Accordingly, what is needed is a system and method for providing a magnetic memory element having elements that can be switched using spin transfer at a lower current density and that consume less power. The present invention addresses such a need.

SUMMARY OF THE INVENTION

The present invention provides a method and system for providing a magnetic element that can be used in a magnetic memory. The magnetic element comprises at least pinned, nonmagnetic spacer, and free layers. The spacer layer resides between the pinned and free layers. The magnetic element is configured to allow the free layer to be switched using spin transfer when a write current is passed through the magnetic element. In some aspects, the magnetic element further comprises a barrier layer, a second pinned layer. In other aspects, the magnetic element further comprises a second spacer layer, a second pinned layer and a second free layer magnetostatically coupled to the free layer. In such aspects, the second spacer layer is between the second pinned and second free layers and a separation layer is preferably provided between the first and second free layers to ensure they are magnetostatically coupled. One or both of the free layers have low saturation magnetizations. Preferably, the low saturation magnetization is achieved by diluting ferromagnetic material(s) in the free layers with nonmagnetic material(s) and/or ferrimagnetically doping the ferromagnetic material(s).

According to the system and method disclosed herein, the present invention provides a magnetic element that can be switched due to spin transfer using a lower current density.

DETAILED DESCRIPTION OF THE INVENTION

Figure 1A:
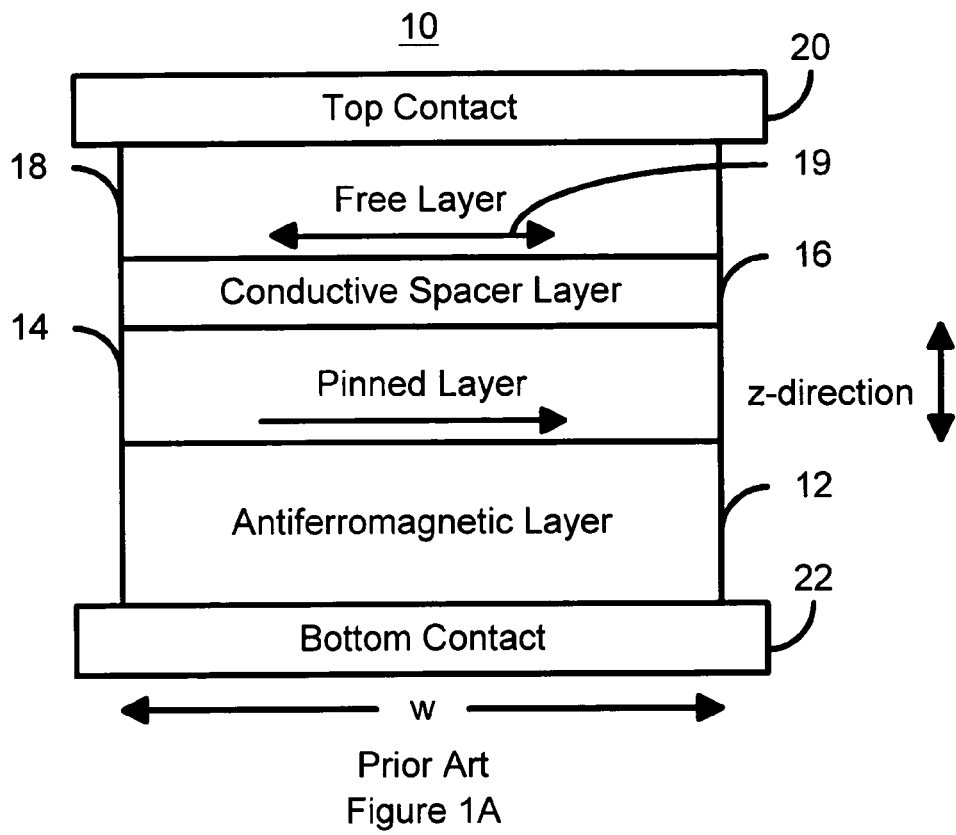
FIG. 1A is a diagram of a conventional magnetic element, a spin valve.
Figure 1B:
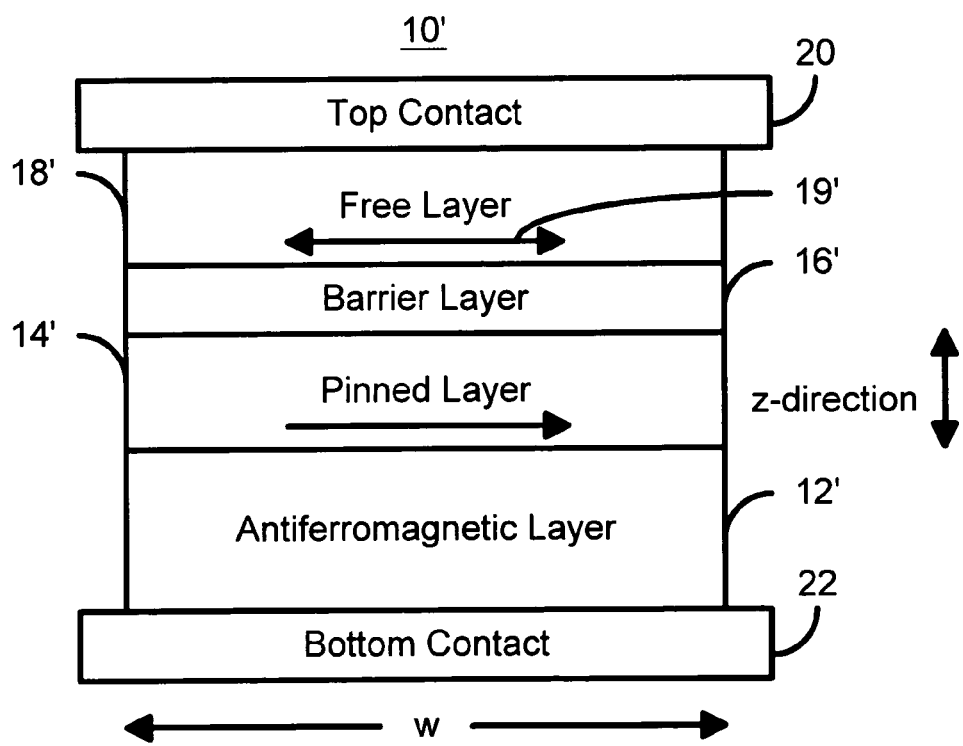
FIG. 1B is a diagram of another conventional magnetic element, a spin tunneling junction.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown, but is to be accorded the widest scope consistent with the principles and features described herein.

The present invention provides a method and system for providing a magnetic element that can be used in a magnetic memory. The magnetic element comprises at least pinned, nonmagnetic spacer, and free layers. The spacer layer resides between the pinned and free layers. The magnetic element is configured to allow the free layer to be switched using spin transfer when a write current is passed through the magnetic element. In some aspects, the magnetic element further comprises a barrier layer, a second pinned layer. In other aspects, the magnetic element further comprises a second spacer layer, a second pinned layer and a second free layer magnetostatically coupled to the free layer. In such an aspect, the second spacer layer is between the second pinned and second free layers and a separation layer is preferably provided between the first and second free layers to ensure they are magnetostatically coupled. One or more of the free layers are configured to have low saturation magnetization. In certain aspects, one or both of the free layers could include ferromagnetic material(s) diluted with nonmagnetic material(s) and/or ferrimagnetically doped to provide low saturation magnetization(s).

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. For example, as depicted in the drawings, the bottoms of the structures are typically closer to an underlying substrate than the tops of the structures. However, one of ordinary skill in the art will readily recognize that the method and system are consistent with other structures having different relationships to the substrate. In addition, the method and system are described in the context of certain layers being synthetic and/or simple. However, one of ordinary skill in the art will readily recognize that the layers could have another structure. For example, although the method and system are described in the context of simple free layers, nothing prevents the present invention from being used with synthetic free layers. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines. Furthermore, the present invention is described in the context of utilizing a low saturation magnetization free layer that provides a lower switching current. One of ordinary skill in the art will readily recognize that the method and system in accordance with the present invention could be combined with other mechanisms for reducing switching current, such as a high perpendicular anisotropy free layer.

Figure 2A:
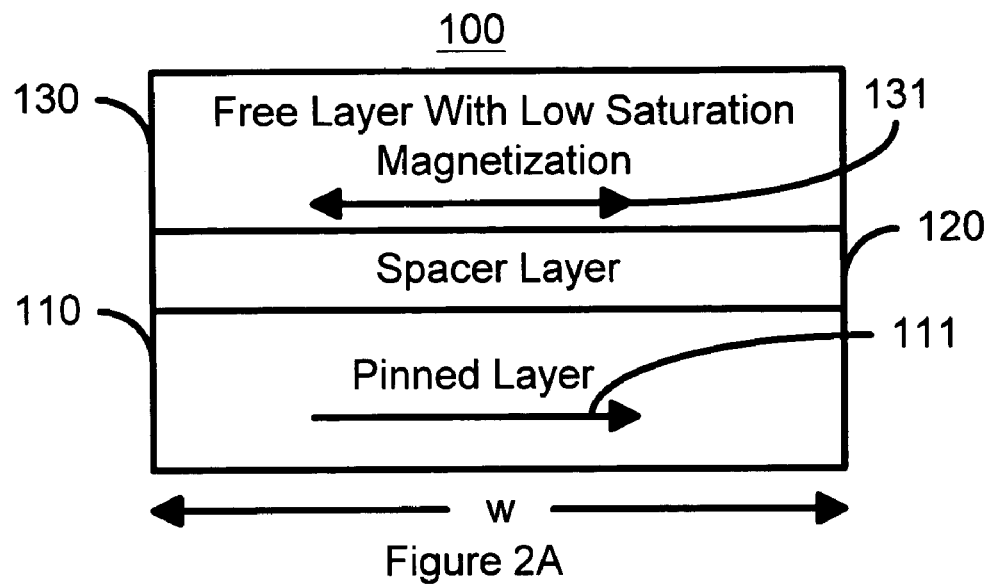
FIG. 2A depicts a first embodiment of a portion of a magnetic element in accordance with the present invention having a reduced write current density for spin transfer switching.

To more particularly illustrate the method and system in accordance with the present invention, refer now to FIG. 2A, depicting a first embodiment of a portion of a magnetic element 100 in accordance with the present invention having a reduced write current density for spin transfer. The magnetic element 100 is preferably used in a magnetic memory, such as a MRAM. Thus, the magnetic element 100 may be used in a memory cell including an isolation transistor (not shown), as well as other configurations of magnetic memories. Moreover, the magnetic element 100 preferably utilizes two terminals (not shown) near the top and bottom of the magnetic element. However, nothing prevents the use of another number of terminals, for example a third terminal near the center of the magnetic element. The magnetic element 100 includes a pinned layer 110, a spacer layer 120, and a free layer 130. As described below, the free layer 130 is configured to have a low saturation magnetization. The magnetic element 100 generally also includes an AFM layer (not shown) used to pin the magnetization 111 of the pinned layer 110, as well as seed layers (not shown) and capping layers (not shown). Furthermore, the magnetic element 100 is configured such that the free layer 130 can be written using spin transfer. In a preferred embodiment, the lateral dimensions, such as the width w, of the free layer 130 are thus small and preferably less than two hundred nanometers. In addition, some difference is preferably provided between the lateral dimensions to ensure that the free layer 130 has a particular easy axis in the plane of the free layer 130.

The pinned layer 110 is ferromagnetic. In one embodiment the pinned layer 110 is synthetic. In such an embodiment, the pinned layer 110 includes ferromagnetic layers separated by nonmagnetic layers and is configured such that the ferromagnetic layers are aligned antiparallel. The pinned layer 110 may be configured to increase the spin dependence of the bulk resistivity of the magnetic element 100. For example, the pinned layer 110, or its ferromagnetic layers, may be a multilayer made up of repeated bilayers (not explicitly shown in FIG. 2A). In one such embodiment, the pinned layer 110 could be a multilayer of $(Fe_xCo_{1-x}/Cu)n$, where n is the number of times the $Fe_xCo_{1-x}/Cu$ bilayer is repeated. In such embodiment, n is greater than one and the Cu layer of the bilayer is preferably one through eight Angstroms thick. The spacer layer 120 is nonmagnetic. In one embodiment, the spacer layer 120 may be conductive, for example including Cu. In another embodiment, the spacer layer 120 is a barrier layer including an insulator such as alumina. In such an embodiment, the barrier layer 120 is less than two nanometers thick such that charge carriers can tunnel between the free layer 130 and the pinned layer 110. The free layer 130 is ferromagnetic and is configured to have a low saturation magnetization. As used herein, a low saturation magnetization refers to a saturation magnetization that is approximately equal to or less than the saturation magnetization of Co, which is around 1430 emu/cm³ at room temperature.

Figure 2B:
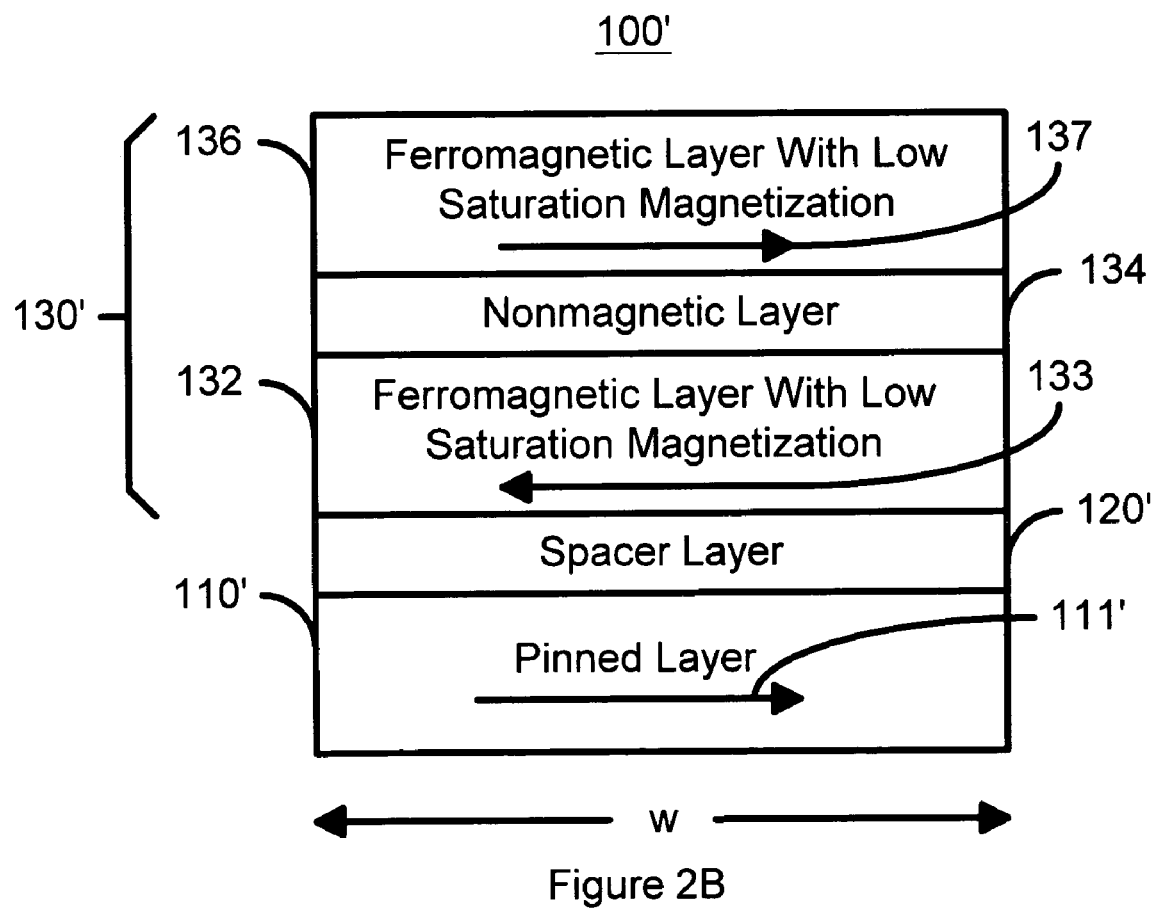
FIG. 2B depicts another version of the first embodiment of a portion of a magnetic element in accordance with the present invention having a reduced write current density for spin transfer switching.

FIG. 2B depicts a magnetic element 100' that is analogous to the magnetic element 100. Thus, analogous components are labeled similarly. The magnetic element 100', therefore, includes a free layer 130' that can be written using spin transfer and that has a low saturation magnetization. However, the free layer 130' is synthetic, including two ferromagnetic layers 132 and 136 separated by a nonmagnetic layer 134 that is preferably Ru. The nonmagnetic layer 134 is configured so that the magnetizations 133 and 137 of the free layer 130' are aligned antiparallel. In addition, either or both of the ferromagnetic layers 132 and 136 has a low saturation magnetization. Referring to FIGS. 2A and 2B, for clarity, the discussion below primarily refers to the free layer 130. However, the principles discussed also apply to the free layer 130', including ferromagnetic layers 132 and 136, and the magnetic element 100'.

Referring back to FIG. 2A, the low saturation magnetization is preferably provided by diluting the ferromagnetic material(s) with nonmagnetic material(s) and/or doping the ferromagnetic material(s) with impurities that promote antiparallel spin alignments. In a preferred embodiment, the low saturation magnetization is provided either by diluting the ferromagnetic material(s) with nonmagnetic material(s) or doping the ferromagnetic material(s) with impurities that promote antiparallel spin alignment, but not both.

The ability of the low saturation magnetization to reduce the switching current density can be understood using the prevalent spin transfer spin-torque model described by J. C. Slonczewski in, "Current-driven Excitation of Magnetic Multilayers," *Journal of Magnetism and Magnetic Materials*, vol. 159, p. L1-L5 (1996). According to Slonczewski's model, the switching current density Jc for the free layer of a spin transfer stack is proportional to:

$\alpha t M_s [H_{eff} - 2\pi M_s]/g(\theta)$ where:
$\alpha$=the phenomenological Gilbert damping constant;
t=the thickness of the free layer;
$M_s$=saturation magnetization of the free layer;
$H_{eff}$=effective field for the free layer;
$g(\theta)$ reflects the spin-transfer efficiency The effective field, $H_{eff}$, includes the external magnetic field, shape anisotropy fields, in-plane and out-of-plane (i.e. perpendicular) anisotropies, and dipolar and exchange fields. The perpendicular anisotropy typically arises from crystalline anisotropy. The term $g(\theta)$ depends on the relative angular orientations of the magnetizations of the pinned layer 110 and the free layer 130.

The magnetization 131 of the free layer 130 lies in the plane of the film (i.e., the magnetization has no component pointing up or down in FIG. 2A) when the out-of-plane demagnetization term $2\pi M_s$ dominates over the term $H_{eff}$. Consequently, for such a film, For a magnetic thin film whose $2\pi M_s$ is much greater than $H_{eff}$, the switching current density is approximately proportional to $M_s^2$. Lowering the saturation magnetization, $M_s$, of the free layer 130 without significantly changing the other relevant parameters such as the damping constant and polarization factors would, therefore, reduce the switching current density.

To obtain low saturation magnetization for the free layer 130, nonmagnetic dilution and/or ferrimagnetic doping are preferably used. Nonmagnetic dilution occurs when a ferromagnetic material and a nonmagnetic material are combined in a single ferromagnetic layer used in or for the free layer 130. Nonmagnetic dilution can also occur when a multilayer that includes alternating ultrathin (preferably one through eight Angstroms thick) and interdiffusing layers of ferromagnetic and nonmagnetic materials is used for a particular ferromagnetic layer. Thus, the low saturation magnetization free layer 130 or, if the free layer 130' is synthetic, its constituent ferromagnetic layers 132 and 136 can be made by combining ferromagnetic and nonmagnetic materials. For example, a low saturation free layer 130 can be provided using the materials CoX, FeX, CoFeX, NiFeX, CoXY, FeXY, CoFeXY, NiFeXY, and/or CoNiFeXY. Here, X or Y=Cr, Cu, Au, B, Nb, Mo, Pt, Pd, Ta, Rh, Ru, Ag, TaN, CuN, TaCuN. In a preferred embodiment, the dilution elements X and Y are in the range of five through sixty atomic percent, except for Pt and Pd which can be in the range of five through eighty atomic percent. For example, $CoCr_{0.157}$ and $CoCr_{0.205}$ have Ms=750 and 450 emu/cm$^2$, respectively. These are significant reductions in the saturation magnetization of pure Co. In another example, $CoB_j$ and/or $CoFeB_j$ where j=0.03 to 0.20 can be used. Such combinations have a lower saturation magnetization, but maintain roughly the same spin polarization. Finally, for the magnetic element 100, or 100' described below, the low saturation free layer 130 provided by dilution includes the material(s) CoX, FeX, NiFeX, CoXY, FeXY, CoFeXY, NiFeXY, and/or CoNiFeXY where X or Y=Cr, Cu, Au, B, Nb, Mo, Pt, Pd, Ta, Rh, Ru, Ag, TaN, CuN, TaCuN; and/or CoFeX where X is Cr, Cu, Au, Nb, Mo, Pt, Pd, Ta, Rh, Ru, Ag, TaN, CuN, TaCuN. It is also noted that one common method to introduce the nitrogen doping in TaN, CuN, or TaCuN, used in X or Y above, is by reactive sputtering where N2 gas is mixed with Ar gas, for example: 0.01-5 mT partial pressure of N2 gas in 1-5 mT partial pressure of Ar gas.

As discussed above, a low saturation magnetization free layer 130 could also be provided by using multilayers. Thus, the free layer 130 or, if the free layer 130 is synthetic, its constituent ferromagnetic layers 132 and 136 can be made by providing a multilayer of ultrathin (preferably one through eight Angstroms thick) and interdiffusing ferromagnetic and nonmagnetic layers. In one embodiment, a multilayer of $(Fe_xCo_{1-x}/Cu)n$ may be used. Thus, a bilayer of a layer of $Fe_xCo_{1-x}$ and a layer of Cu are present in each repetition of the multilayer. In such an embodiment, the number of repetitions of the bilayer is n, where n is greater than one. Furthermore, x represents the atomic percentage of Fe. Thus, x is less than one and is preferably 0.5. Also in a preferred embodiment, the Cu and FeCo layers of such bilayers are between one and eight Angstroms thick. The resulting multilayer can be used as a low saturation magnetization material for providing the free layer or its constituent ferromagnetic layers. Because of the very thin, discontinuous Cu layers, significant interdiffusion between the FeCo and Cu may occur in the bilayers of the multilayer $(Fe_xCo_{1-x}/Cu)n$ stack, especially after some annealing. This interdiffusion results in a low saturation magnetization. Further, for the multilayer $(Fe_xCo_{1-x}/Cu)n$, there is an increase in the spin dependence of the bulk resistivity. This increase in the spin dependence of the bulk resistivity offers an additional advantage in using the multilayer approach for diluting the free layer 130.

Ferrimagnetic doping can also be used to provide the low saturation magnetization of the free layer 130. In such an embodiment, the free layer 130 or the ferromagnetic layers 132 and 136, would be provided using a ferromagnetic material that has undergone ferrimagnetic doping. Ferrimagnetic doping generally occurs when a ferromagnet is doped with impurities that promote antiparallel alignments of spins. This alignment of spins can result in a ferrimagnet with a strongly reduced saturation magnetization. For example, doping of Gd and Tb into $Ni_{81}Fe_{19}$ has been shown to result in rapid reduction of saturation magnetization. This reduction in saturation magnetization is consistent with the theory that the Gd and Tb spins align antiparallel to the $Ni_{81}Fe_{19}$ magnetization. For a further discussion of such a doping, see William Bailey, et al. "Control of magnetization dynamics in $Ni_{81}Fe_{19}$ thin films through the use of rare-earth dopants." IEEE Transactions on Magnetics, Volume 37, Number 4, July 2001, pp. 1749-1754. It is noted, however, that Tb doping can increase damping significantly, unlike Gd doping. An increase of the phenomenological Gilbert damping constant $\alpha$ could negate some or all of the switching current density reduction brought about by the low saturation magnetization. Consequently, doping using Gd would be preferred over that using Tb. In either case, the rare earth should be in the range of five through sixty atomic percent.

Thus, in an embodiment of the magnetic element 100, the saturation magnetization of the free layer 130 can be lowered by ferrimagnetic doping of the ferromagnetic material used in the free layer 130. In some embodiments, ferrimagnetic doping is performed such that the combination of materials used is CoX, FeX, CoFeX, and/or NiFeX where X is the rare earth elements Gd and/or Tb. An additional dopant, such as Cr, Cu, Au, Nb, Mo, Pt, Pd, Ta, Rh, or Ru, could also be provided to further reduce the saturation magnetization.

Figure 3:
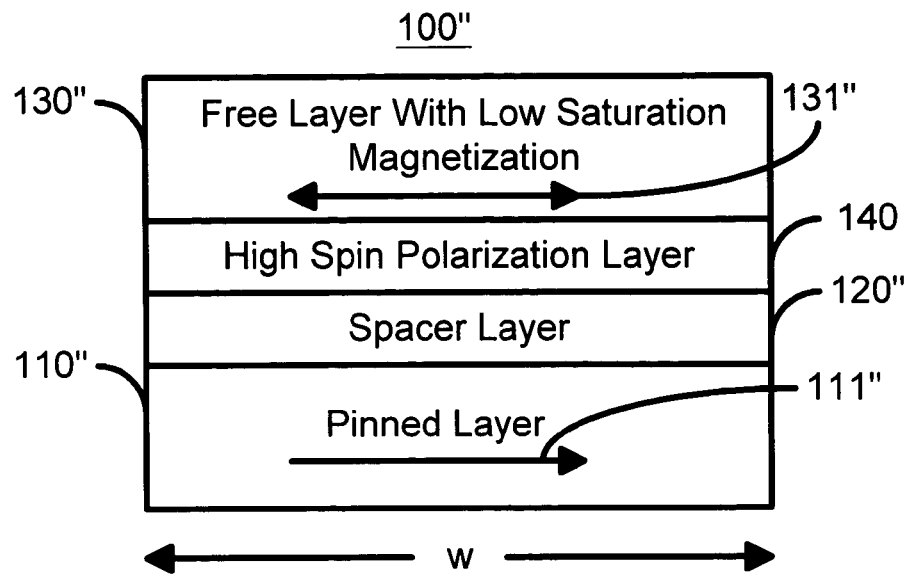
FIG. 3 depicts a version of the first embodiment of a portion of a magnetic element in accordance with the present invention having a reduced write current density for spin transfer switching due to low saturation magnetization.

Furthermore, the magnetic element 100 may include at least one thin coating of a high spin polarization material. One embodiment of such a magnetic element 100" is depicted in FIG. 3. The magnetic element 100" is analogous to the magnetic element 100. Thus, analogous components are labeled similarly. Moreover, the magnetic element 100" preferably utilizes two terminals (not shown) near the top and bottom of the magnetic element. However, nothing prevents the use of another number of terminals, for example a third terminal near the center of the magnetic element. Therefore, the magnetic element includes a free layer 130" with a low saturation magnetization and is written using spin transfer. The magnetic element 100" also includes a high spin polarization layer 140, such as CoFe three to eight angstroms thick, at the interface between the free layer 130" and the spacer layer 120" to increase magnetoresistance and spin torque. A high spin polarization material has higher spin polarization than the adjacent ferromagnetic layer. If the free layer 130" is synthetic, for example as in the magnetic element 100' depicted in FIG. 2B, then each ferromagnetic layer 132 and 136 is sandwiched between high spin polarization layers such as the high spin polarization layer 140. Thus, the low saturation magnetization of the free layer 130, 130', and/or 130", and the resulting reduction in the switching current density, could be provided in a number of ways.

Thus, the magnetic element 100, 100', and 100" include free layers 130, 130', and 130", respectively, having a low saturation magnetization as defined above. Consequently, the magnetic elements 100, 100', and 100" can be written using spin transfer at a lower switching current. Thus, the benefits of a low switching current can be achieved.

Figure 4:
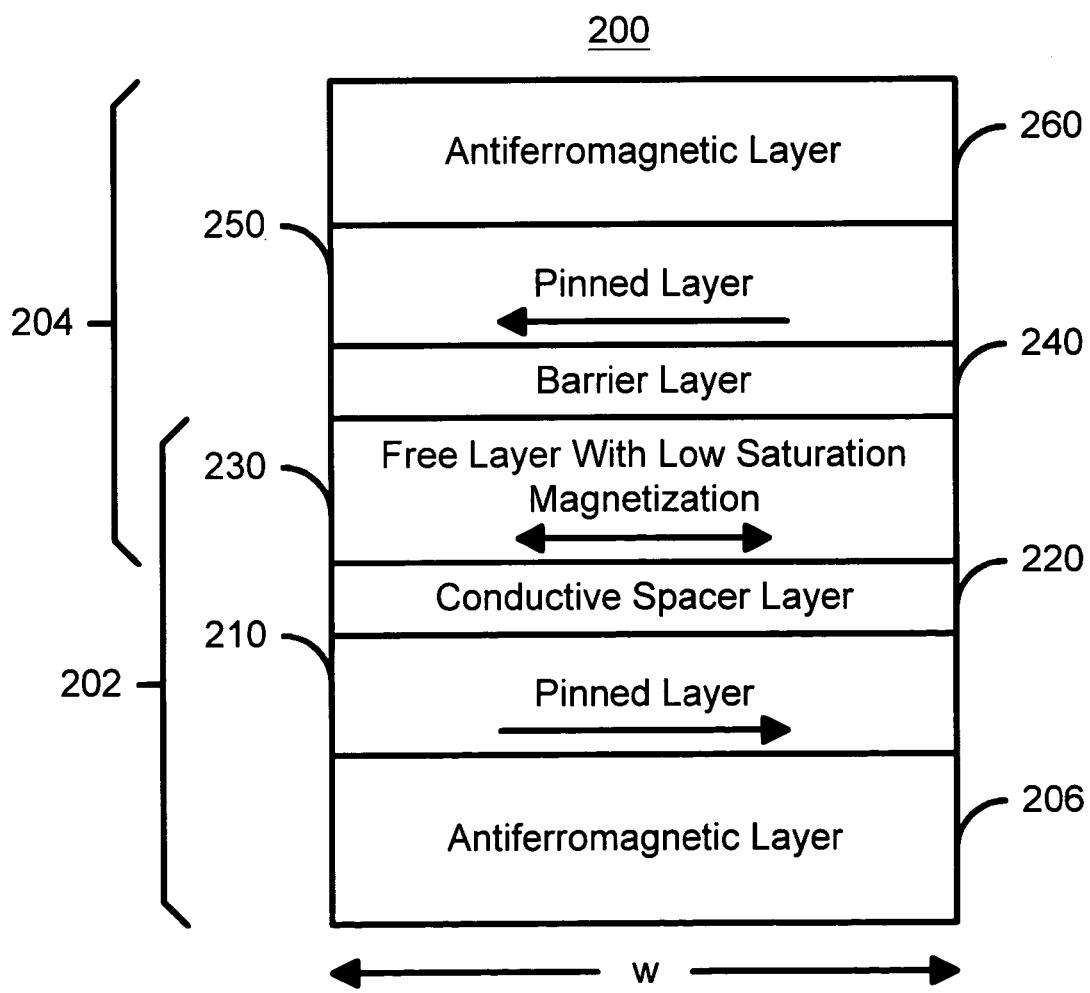
FIG. 4 depicts a second embodiment of a magnetic element in accordance with the present invention having a reduced write current density for spin transfer switching.

FIG. 4 depicts a second embodiment of a magnetic element 200 in accordance with the present invention having a reduced write current density for spin transfer. The magnetic element 200 includes a spin valve portion 204 and a spin tunneling junction portion 202 that share a free layer 230. The spin valve portion 204 includes a pinning layer 260 that is preferably an antiferromagnetic (AFM) layer 260, pinned layer 250, conductive spacer layer 240 such as Cu, and a free layer 230. In an alternate embodiment, the conductive spacer layer 240 could be replaced by a barrier layer. The spin tunneling junction portion 202 includes a pinning layer 206 that is preferably an antiferromagnetic (AFM) layer 206, pinned layer 210, barrier layer 220 that is an insulator configured to allow electrons to tunnel through it, and the free layer 230. Referring to FIGS. 2A and 4, the layers 250, 240, and 230 are analogous to the layers 110, 120, and 130 in the magnetic element 100 when the spacer layer 120 is conducting. Similarly, the layers 210, 220, and 230 are analogous to the layers 110, 120, and 130, respectively, when the spacer layer 120 is an insulating barrier layer. The pinned layers 210 and 250 thus preferably correspond to the pinned layers 110 and can be configured using analogous materials, layers, and/or process. For example, the pinned layer 210 and/or the pinned layer 250 may include multilayer (Fe$_x$Co$_{1-x}$/Cu)n, where the n is the number of repeats that is greater than one. In addition, the Fe atomic percent, x, is preferably approximately 0.5 and the Cu layers are preferably one through eight Angstroms thick. The free layer 230 is configured to be written using spin transfer and has a low saturation magnetization. Moreover, the magnetic element 200 preferably utilizes two terminals (not shown) near the top and bottom of the magnetic element. However, nothing prevents the use of another number of terminals, for example a third terminal near the center of the magnetic element 200. The magnetic element 200 also includes pinning layers 206 and 260 that are preferably AFM layers used in pinning the magnetizations of the pinned layers 210 and 250, respectively.

The free layer 230 is preferably configured in a manner analogous to the free layers 130, 130', and/or 130". Thus, analogous materials and principles to those discussed above may be used to achieve the low saturation magnetization of the free layer 230. For example, dilution with nonmagnetic materials and/or ferrimagnetic doping could be used to achieve a low saturation magnetization for the free layer 330. In addition, as discussed above with respect to the free layer 130', the free layer 230 can be synthetic. Consequently, the magnetic element 200 can be written using spin transfer at a lower switching current density. Stated differently, the magnetic element 200 can share the benefits of the magnetic elements 100, 100', 100", and their combinations. Furthermore, when the pinned layers 210 and 250 are aligned antiparallel, both the spin valve portion 204 and the spin tunneling junction portion 202 can contribute to writing the free layer 230. Because of the use of the barrier layer 220, the magnetic element 200 has higher resistance and magnetoresistance. Consequently, a higher signal may be obtained during reading.

Figure 5A:
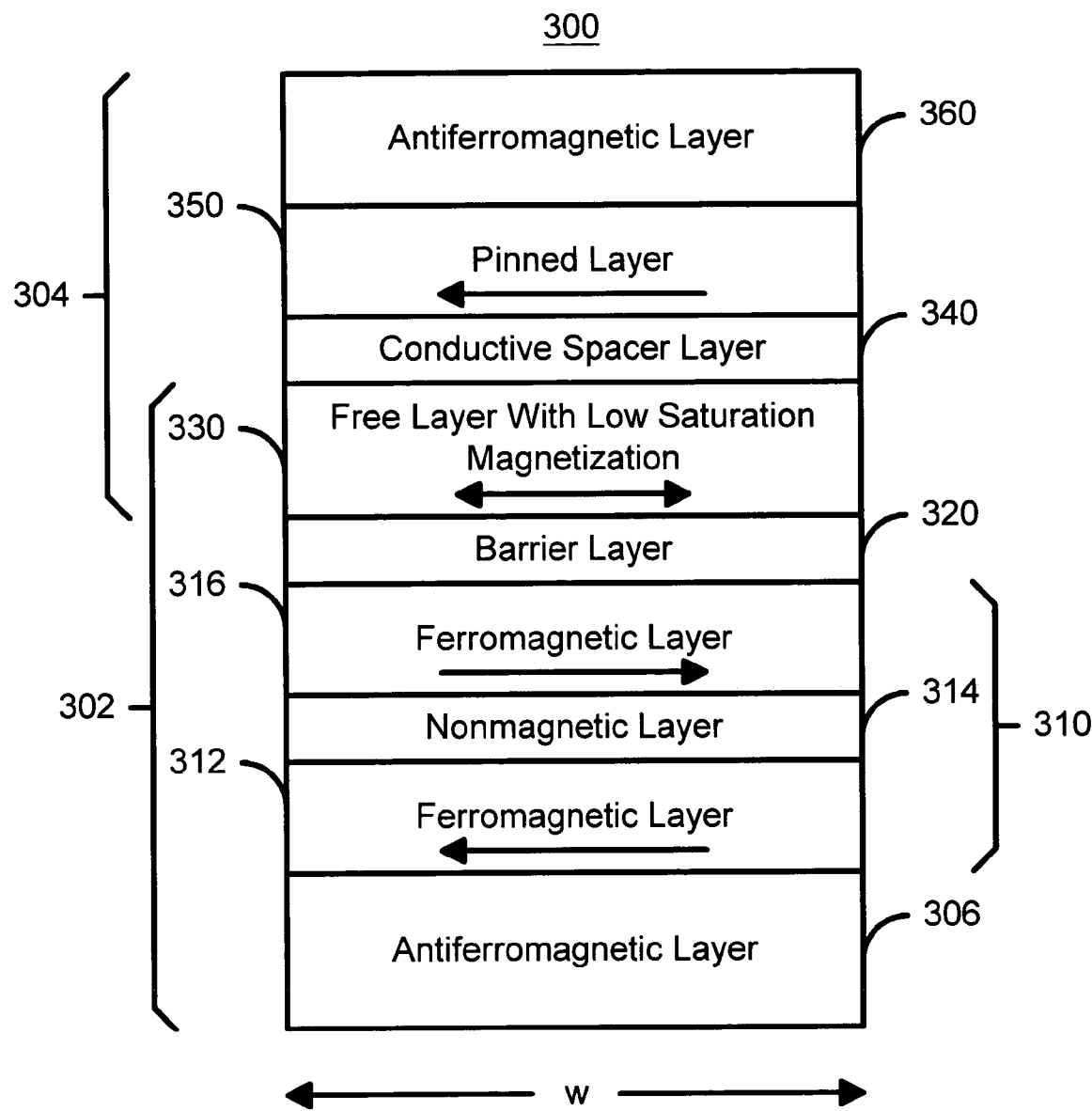
FIG. 5A is a preferred version of the second embodiment of a magnetic element in accordance with the present invention having a reduced write current density for spin transfer switching.

FIG. 5A is a preferred version of the second embodiment of a magnetic element 300 in accordance with the present invention having a reduced write current density for spin transfer. The magnetic element 300 is analogous to the magnetic element 200 depicted in FIG. 4. Thus, analogous components are labeled similarly. Therefore, the magnetic element includes a free layer 330, which corresponds to the free layer 230, that has a low saturation magnetization, and which is written using spin transfer. Moreover, the magnetic element 300 preferably utilizes two terminals (not shown) near the top and bottom of the magnetic element. However, nothing prevents the use of another number of terminals, for example a third terminal near the center of the magnetic element.

The free layer 330 is preferably configured in a manner analogous to the free layers 130, 130', 130", and/or the free layer 230. Thus, analogous materials and principles to those discussed above may be used to achieve the low saturation magnetization of the free layer 330. For example, dilution with nonmagnetic materials and/or ferrimagnetic doping could be used to achieve a low saturation magnetization for the free layer 330. In addition, as discussed above with respect to the free layer 130', the free layer 330 can be synthetic. Because of the low saturation magnetization of the free layer 330, the magnetic element 300 can be written using spin transfer at a lower switching current density. Stated differently, the magnetic element 300 can share the benefits of the magnetic elements 100, 100', 100", 200 and their combinations. Because of the use of the barrier layer 340, the magnetic element 300 has higher resistance and magnetoresistance. Consequently, a higher signal may be obtained during reading. In an alternate embodiment, the barrier layer 320 may be replaced by a conductive layer.

However, in such an embodiment, the read signal is decreased for a given read current.

In the magnetic element 300, the pinned layer 310 is synthetic. The pinned layer 310 thus includes ferromagnetic layers 312 and 316 separated by a nonmagnetic layer 314, which is preferably Ru. The nonmagnetic layer is configured such that the ferromagnetic layers 312 and 316 are antiferromagnetically aligned. Furthermore, the magnetic element 300 is configured such that the ferromagnetic layer 316 and the pinned layer 350 are antiparallel. As a result, the spin valve portion 304 and the spin tunneling junction portion 310 can both contribute to the spin transfer used to write to the magnetic element 300. Thus, an even lower switching current can be used to write to the magnetic element 300. In addition, because adjacent layers 312 and 350 have their magnetizations aligned parallel, the AFM layers 306 and 360 can be aligned in the same direction. The AFM layers 306 and 360 can, therefore, be aligned in the same step. Thus, processing is further simplified.

Figure 5B:
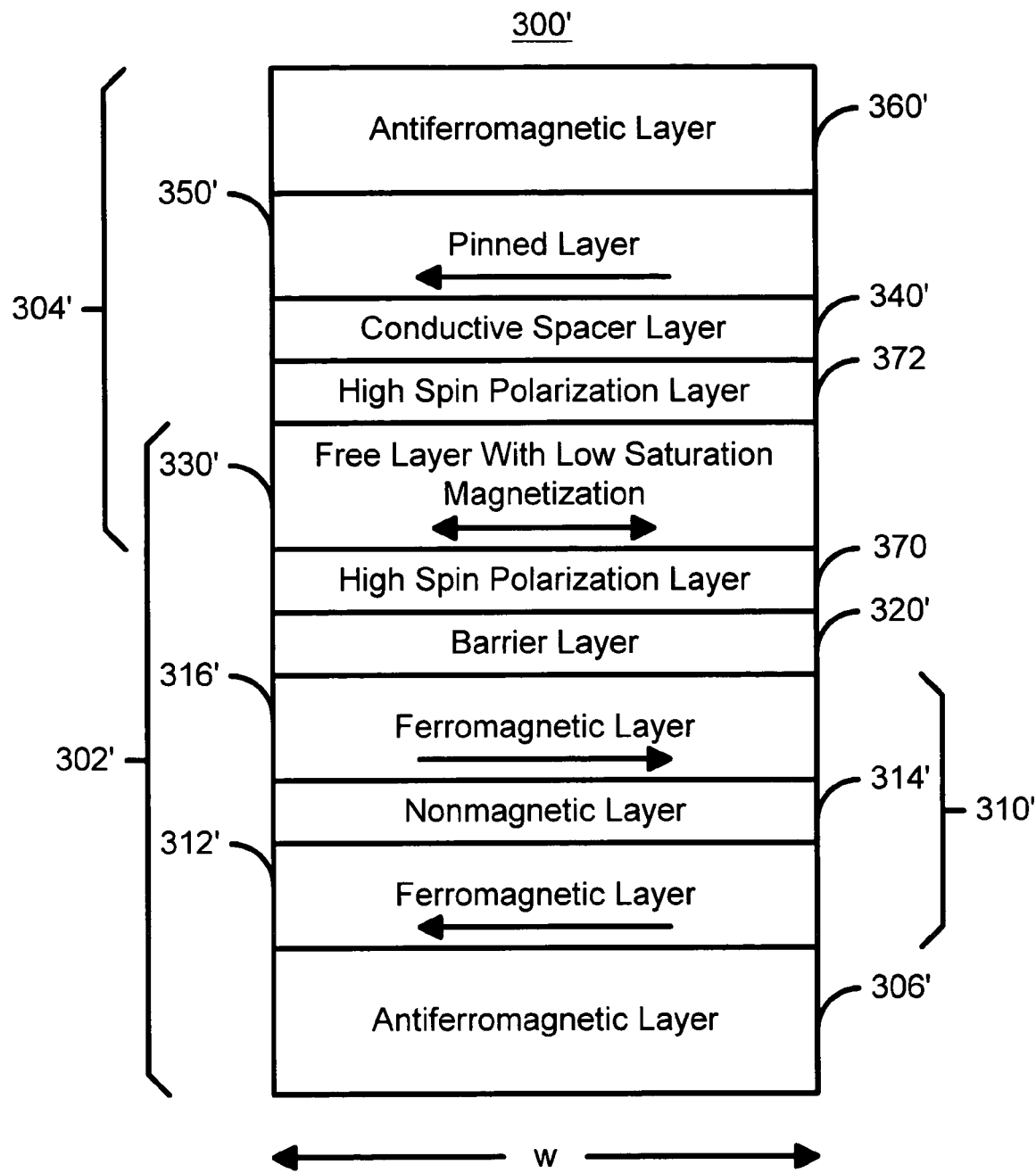
FIG. 5B depicts another version of the second embodiment of a portion of a magnetic element in accordance with the present invention having a reduced write current density for spin transfer switching due to a low saturation magnetization free layer.

The free layers 230 and 330, as well as the magnetic elements 200 and 300, can be configured in an analogous manner to that discussed above. For example, FIG. 5B depicts another version of the second embodiment 300' of a portion of a magnetic element in accordance with the present invention having a reduced write current density for spin transfer due to at least a low saturation magnetization. The magnetic element 300' is analogous to the magnetic element 300 and, therefore, shares its advantages. For example, the free layer 330' had a low saturation magnetization. Furthermore, in a manner similar to the magnetic element 100" depicted in FIG. 3, the magnetic element 300' includes high spin polarization layers 370 and 372, which preferably include CoFe three to eight Angstroms thick. Note that the layer 370, the layer 372 or both might be used. If the free layer 330' were synthetic, then each constituent ferromagnetic layer (not shown) would preferably have a low saturation magnetization. In such an embodiment, each of the ferromagnetic layers would preferably be sandwiched between high spin polarization materials. Thus, benefits similar to those discussed above with respect to FIG. 3A are achieved.

Figure 6:
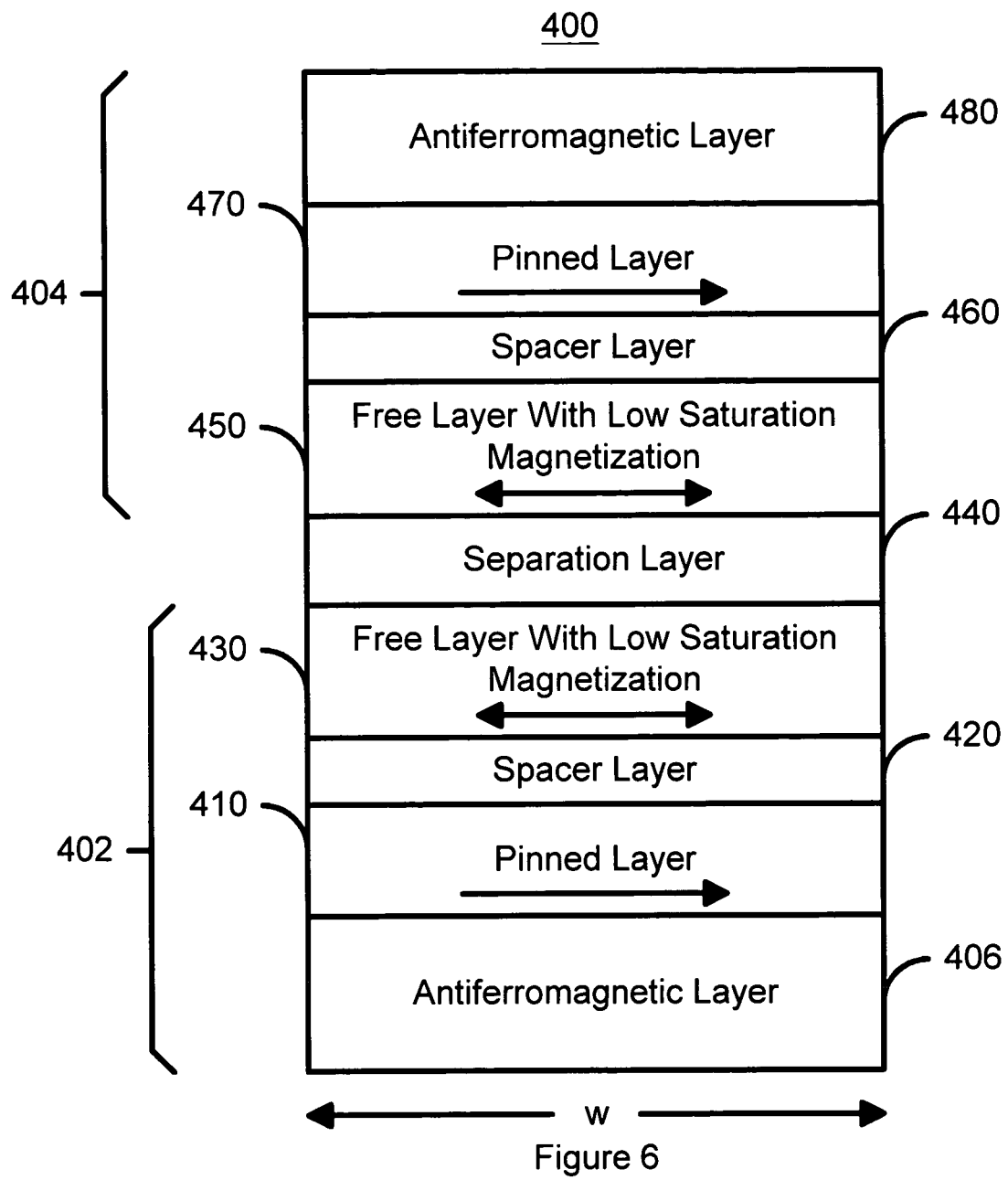
FIG. 6 depicts a third embodiment of a portion of a magnetic element in accordance with the present invention having a reduced write current density for spin transfer switching.

FIG. 6 depicts a third embodiment of a portion of a magnetic element 400 in accordance with the present invention having a reduced write current density for spin transfer. The magnetic element includes two structures 402 and 404, each of which is analogous to the magnetic element 100, 100', or 100". Thus, the structure 402 includes a pinned layer 410, a spacer layer 420, and a free layer 430 that are analogous to, for example, the layers 110, 120, and 130, respectively, of the magnetic element 100. The structure 402 also includes pinning layer 406 that is preferably an AFM layer. Similarly, the structure 404 includes a pinned layer 470, a spacer layer 460, and a free layer 450 that are analogous to, for example, the layers 110, 120, and 130, respectively, of the magnetic element 100. The structure 404 also includes pinning layer 480 that is preferably an AFM layer. One or both of the free layers 430 and 450 have a low saturation magnetization. The free layer 430 and/or 450 may also be synthetic. In such a case the ferromagnetic layers (not explicitly shown) within the free layer 430 and/or 450 would have a low saturation magnetization. Furthermore, the free layers 430 and 450 of the magnetic element 400 are magnetostatically coupled, preferably so that the layers 430 and 450 are antiferromagnetically aligned. In the embodiment shown, the magnetic element 400 includes a separation layer 440. The separation layer 440 is configured to ensure that the free layers 430 and 450 are only magnetostatically coupled. For example, the thickness of the separation layer 440, which is preferably a nonmagnetic conductor, is preferably configured to ensure that the free layers 430 and 450 are antiferromagnetically aligned due to a magnetostatic interaction. In particular, the separation layer 440 serves to randomize the polarization of the spins passing through it. For example, the separation layer 440 includes materials such as Cu, Ag, Au, Pt, Mn, CuPt, CuMn, a Cu/Pt/Cu sandwich, a Cu/Mn/Cu sandwich, or a Cu/PtMn[1-20A]/Cu sandwich. Although the separation layer is used in the magnetic element 400, nothing prevents another mechanism from being used. For example, in one embodiment, the structure 402 might be a dual structure including a second pinned layer (not shown), a second spacer layer (not shown), and a pinning layer (not shown). The thicknesses of the second pinned and spacer layers, as well as the pinning layer may be configured to ensure that the free layers 430 and 450 are magnetostatically coupled.

The free layer 430 and/or the free layer 450 are configured to have a low saturation magnetization, as defined above. Thus, the free layer 430 and/or 450 may correspond to the free layers 130, 130', or 130". Stated differently, the materials and/or properties used in the free layer 430 and/or the free layer 450 are the same as or analogous to those described above with respect to the magnetic elements 100, 100', or 100". Thus, the magnetic element 400 shares many of the benefits of the magnetic elements 100, 100', and 100". In particular, the magnetic element can be written using spin transfer at a lower switching current density.

The magnetostatic coupling between the free layers 430 and 450 provides further benefits. Because the free layers 450 and 430 are magnetostatically coupled, a change in magnetization of the free layer 450 is reflected in the free layer 430. The spacer layer 420 can be replaced with a barrier layer to provide a high signal. Furthermore, because they have separate free layers 450 and 430 the properties of the spin valve 404 and the spin tunneling junction 402, respectively, can be separately tailored to improve their functions of the spin valve and spin tunneling junction, respectively.

Figure 7A:
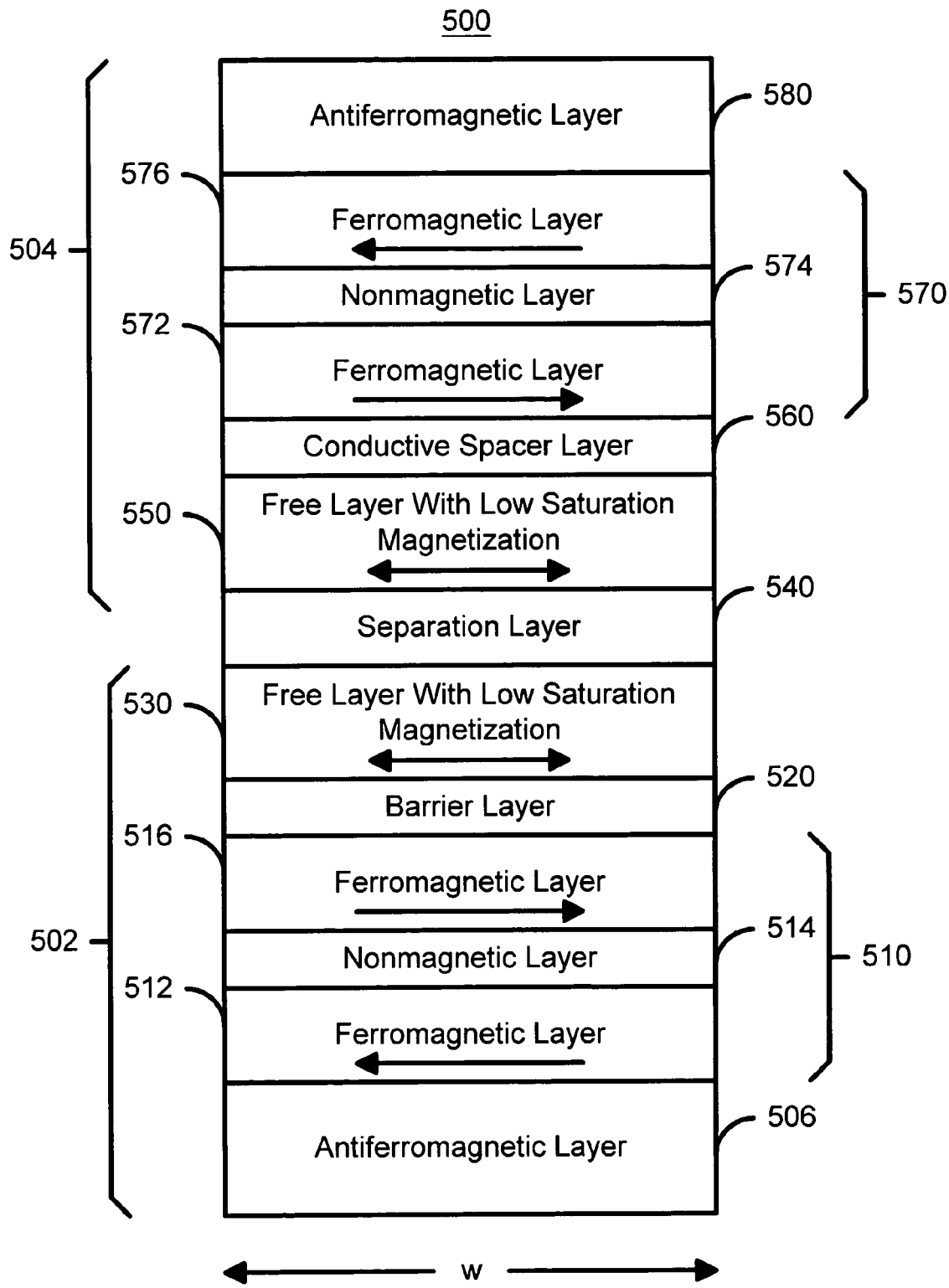
FIG. 7A is a preferred version of the third embodiment of a magnetic element in accordance with the present invention having a reduced write current density for spin transfer switching.

FIG. 7A is a preferred version of the third embodiment of a magnetic element 500 in accordance with the present invention having a reduced write current density for spin transfer. The magnetic element 500 is analogous to the magnetic element 400 depicted in FIG. 6. Thus, analogous components are labeled similarly. Therefore, the magnetic element includes free layers 530 and 550, which corresponds to the free layers 430 and 450, respectively, either or both of which has low saturation magnetization, and both of which are written using spin transfer. The free layer 530 and/or 550 may also be synthetic. In such a case the ferromagnetic layers (not explicitly shown) within the free layer 530 and/or 550 would have a low saturation magnetization. Moreover, the magnetic element 500 preferably utilizes two terminals (not shown) near the top and bottom of the magnetic element. However, nothing prevents the use of another number of terminals, for example a third terminal near the center of the magnetic element 500.

The pinned layers 510 and 570 are synthetic. Thus, the pinned layer 510 includes ferromagnetic layers 512 and 516 separated by a nonmagnetic layer 514 that is preferably Ru. The magnetizations of the ferromagnetic layers 512 and 516 are also aligned antiparallel. Similarly, the pinned layer 570 includes ferromagnetic layers 572 and 576 separated by a nonmagnetic layer 574 that is preferably Ru. The magnetizations of the ferromagnetic layers 572 and 576 are also aligned antiparallel. Furthermore, the spacer layer 520 is preferably a barrier layer that is insulating yet allows electrons to tunnel between the ferromagnetic layer 516 and the free layer 530. The spacer layer 560 is preferably a conductive layer. Thus, the structure 502 is a spin tunneling junction, while the structure 504 is a spin valve.

The free layers 530 and/or 550 are preferably configured in a manner analogous to the free layers 130, 130', 130", or the free layers 430 and 450, respectively. Thus, analogous materials and principles to those discussed above may be used to achieve the low saturation magnetization of the free layers 430 and/or 450. For example, dilution with nonmagnetic materials and/or ferrimagnetic doping could be used to achieve a low saturation magnetization for the free layer 530 and/or 550. Thus, the materials discussed above with respect to the free layers 130, 130', and 130" are preferred. In addition, as discussed above with respect to the free layer 130', the free layers 530 and/or 550 can be synthetic. Because of the low saturation magnetization, the magnetic element 500 can be written using spin transfer at a lower switching current density. Stated differently, the magnetic element 500 can share the benefits of the magnetic elements 100, 100', 100", and their combinations.

Furthermore, because the free layers 530 and 550 are magnetostatically coupled, a change in magnetization direction of the free layer 550, for example due to spin transfer induced writing, is reflected in the magnetization of the free layer 530. With the barrier layer 520, the spin tunneling junction 502 provides a high signal. In an alternate embodiment, the barrier layer 320 may be replaced by a conducting layer. However, in such an embodiment, the read signal is decreased for a given read current.

In addition, as can be seen in FIG. 7A, the pinned layer 510 and 570 are synthetic. The pinned layer 510 thus includes ferromagnetic layers 512 and 516 separated by a nonmagnetic layer 514, which is preferably Ru. The nonmagnetic layer 514 is configured such that the ferromagnetic layers 512 and 516 are antiferromagnetically aligned. Similarly, the pinned layer 510 includes ferromagnetic layers 572 and 576 separated by a nonmagnetic layer 574, which is preferably Ru. The nonmagnetic layer 574 is configured such that the ferromagnetic layers 572 and 576 are antiferromagnetically aligned. Furthermore, the magnetic element 500 is configured such that the magnetizations of the ferromagnetic layer 512 and the ferromagnetic layer 576 are parallel. Because ferromagnetic layers 512 and 576 have their magnetizations aligned parallel, the AFM layers 506 and 580 can be aligned in the same direction. The AFM layers 506 and 580 can, therefore, be aligned in the same step. Thus, processing is further simplified.

Figure 7B:
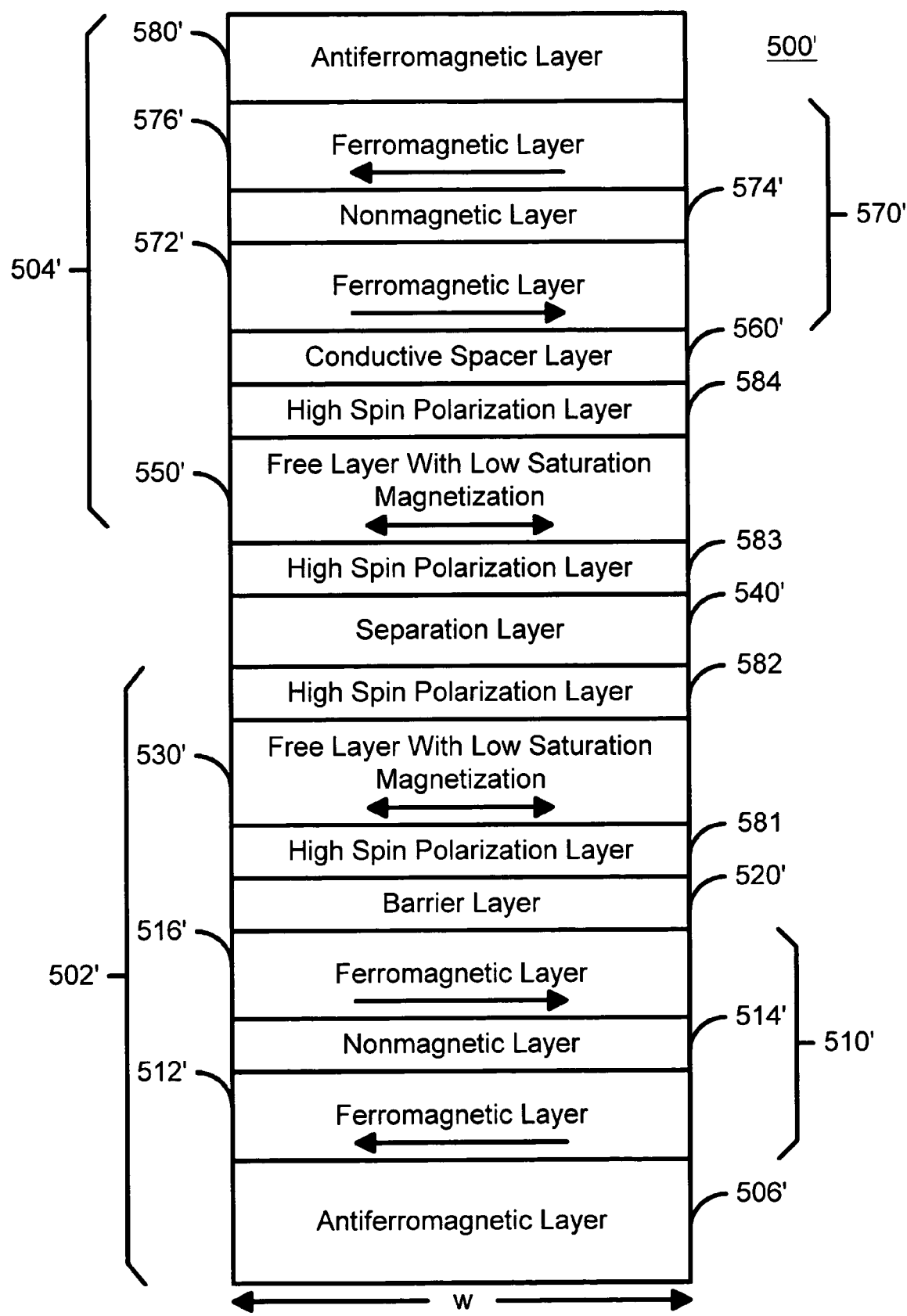
FIG. 7B depicts another version of the third embodiment of a portion of a magnetic element in accordance with the present invention having a reduced write current density for spin transfer switching due to at least low saturation magnetization.

As previously mentioned, the free layers 530 and 550, as well as the magnetic element 500, can be configured in an analogous manner to that discussed above. For example, FIG. 7B is another version of the third embodiment of a magnetic element 500' in accordance with the present invention having a reduced write current density for spin transfer due to at least low saturation magnetization free layer(s). The magnetic element 500' is analogous to the magnetic element 500 and, therefore, shares its advantages. For example, the free layers 530' and/or 550' have low saturation magnetizations. Furthermore, in a manner similar to the magnetic element 100" depicted in FIG. 3, the magnetic element 500' includes high spin polarization layers 581, 582, 583, and 584, which preferably include CoFe three to eight Angstroms thick. Note that the layer(s) 581 and 583 or the layers 581, 582, 583, and 584 or both might be used. If the free layer 530' and/or 550' were synthetic, then each constituent ferromagnetic layer (not shown) would preferably have a low saturation magnetization. In such an embodiment, each of the ferromagnetic layers would preferably be sandwiched between high spin polarization materials. Thus, benefits similar to those discussed above with respect to FIG. 3 are achieved. Moreover, the ferromagnetic layers 576' and 512' are parallel. Accordingly, the AFM layers 506' and 580' can be aligned in a single step. Processing is thereby simplified.

Thus, the magnetic elements 100, 100', 100", 200, 300, 300', 400, 500, and 500' can be written using spin transfer at a lower switching current density due to low saturation magnetization in at least one free layer. Furthermore, aspects of the magnetic elements 100, 100', 100", 200, 300, 300', 400, 500, and 500' can be combined to provide further benefits.

Figure 8:
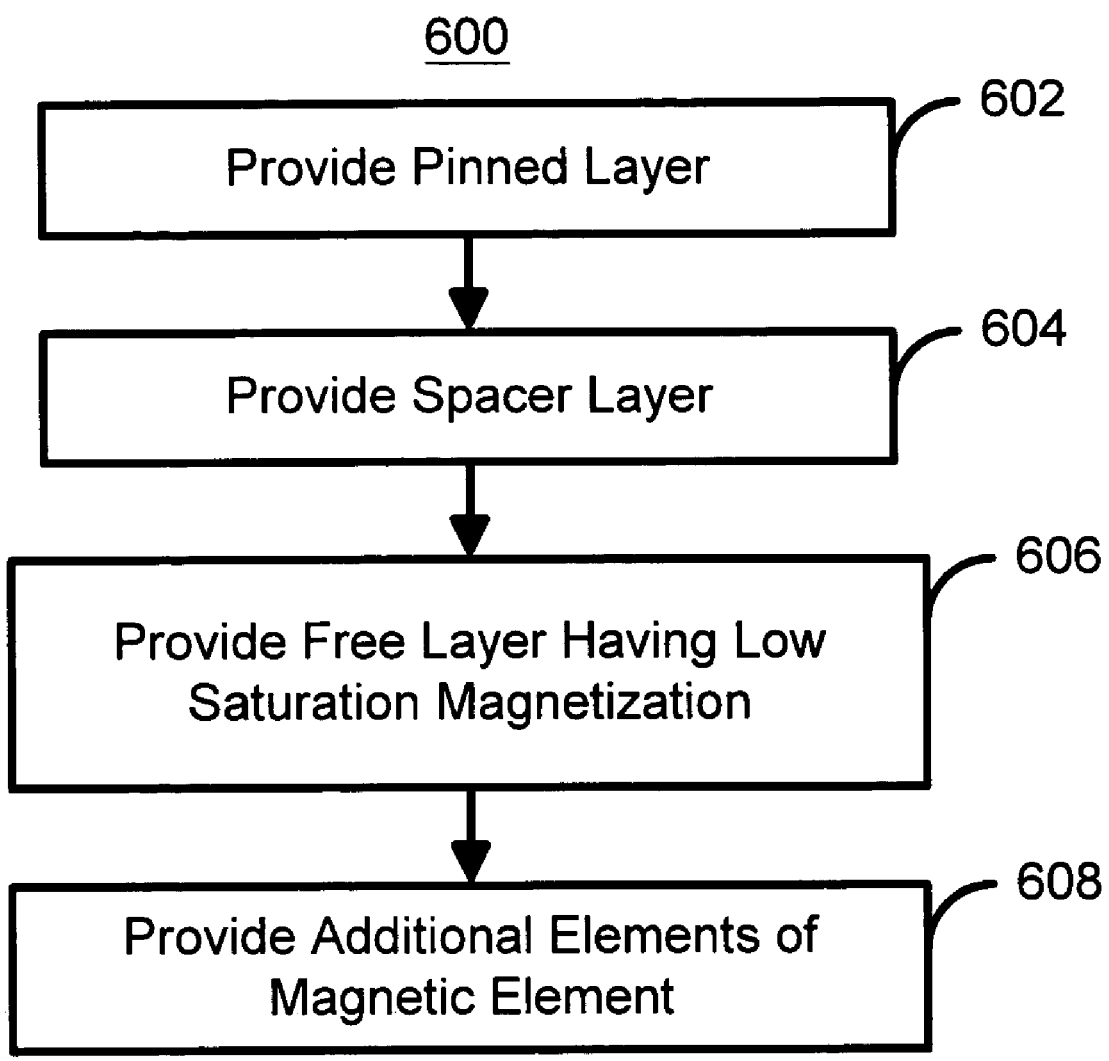
FIG. 8 depicts a flow chart of a one embodiment of a method in accordance with the present invention for providing one embodiment of a magnetic element in accordance with the present invention having a reduced write current density for spin transfer switching.

FIG. 8 depicts a flow chart of a one embodiment of a method 600 in accordance with the present invention for providing one embodiment of a magnetic element in accordance with the present invention having a reduced write current density for spin transfer. The method 600 is described in the context of the magnetic element 100. However, nothing prevents the method 600 from being adapted to provide the magnetic elements 100', 100", 200, 300, 300', 400, 500, or 500'. A pinned layer, such as the pinned layer 110 is provided, via step 602. In one embodiment, step 602 includes providing a synthetic pinned layer. The spacer layer 120 is provided, via step 604. Step 604 can include providing a barrier layer or a conducting layer. The free layer 130 having a low saturation magnetization is provided, via step 606. In some embodiments, the high spin polarization layer may be provided prior to and/or after step 606. Step 606 can include providing a synthetic free layer. In such an embodiment, step 606 may also include providing high spin polarization layers adjacent to the ferromagnetic layers of the free layer. If the magnetic elements 200, 300, 300', 400, 500, and/or 500', are being provided, additional pinned layers, spacer layers and, in some embodiments, free layers are provided, via step 608. In such embodiments, the free layers may have a low saturation magnetizations. Thus, the magnetic elements 100', 100", 200, 300, 300', 400, 500, and/or 500' may be provided.

A method and system has been disclosed for providing a magnetic element that can be written using spin transfer at a lower switching current density. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
   a pinned layer;
   a spacer layer, the spacer layer being nonmagnetic; and
   a free layer having a free layer magnetization, the spacer layer residing between the pinned layer and the free layer, the free layer including at least one of a doped ferromagnetic material and a multilayer, the doped ferromagnetic material including at least one ferromagnetic material that is diluted with at least one of at least one nonmagnetic material and ferrimagnetically doped such that the free layer has a low saturation magnetization;
   wherein if the free layer includes the at least one ferromagnetic material that is diluted with the at least one nonmagnetic material, then the free layer includes at least CoX, FeX, CoFeX, NiFeX, CoXY, FeXY, CoFeXY, NiFeXY, and/or CoNiFeXY where X or Y is Cr, Cu, Au, B, Nb, Mo, Pt, Pd, Ta, Rh, Ru, Ag, TaN, CuN, TaCuN, and/or CoFeX where X is Cr, Cu, Au, Nb, Mo, Pt, Pd, Ta, Rh, Ru, Ag, TaN, CuN, and TaCuN;

wherein the magnetic element is configured to allow the free layer magnetization to be switched due to spin transfer when a write current is passed through the magnetic element.

2. The magnetic element of claim 1 wherein X and Y are at least five atomic percent and less than or equal to sixty atomic percent, except for Pt and Pd which can be in the range of five through eighty atomic percent.

3. The magnetic element of claim 1 wherein the free layer includes CoX, FeX, CoFeX, NiFeX, and/or CoNiFeX where X includes at least one rare earth element in a range of five to sixty atomic percent.

4. The magnetic element of claim 3 wherein the at least one rare earth element is Gd or Tb from five to sixty atomic percent.

5. The magnetic element of claim 3 wherein the free layer further includes at least one additional dopant, the at least one additional dopant including Cr, Cu, Au, Nb, Mo, Pt, Pd, Ta, Rh, and/or Ru.

6. The magnetic element of claim 1 further comprising:
a high spin polarization layer residing between the free layer and the spacer layer.

7. The magnetic element of claim 1 wherein the pinned layer includes a plurality of bilayers, each of the plurality of bilayers includes a $Fe_xCo_{1-x}$ and a Cu layer, x less than one.

8. The magnetic element of claim 4 wherein X and Y are at least five atomic percent and less than or equal to sixty atomic percent for Cr, Cu, Au, B, Nb, Mo, Pt, Pd, Ta, Rh, Ru, Ag, TaN, CuN, and/or TaCuN and at least five atomic percent and less than or equal to eighty atomic percent for Pt and Pd.

9. The magnetic element of claim 1 wherein
the free layer includes the at least one ferromagnetic material that is diluted with the at least one nonmagnetic material, then the free layer includes at least CoX, FeX, NiFeX, CoXY, FeXY, CoFeXY, NiFeXY, and/or CoNiFeXY where X or Y is Cr, Rh, Ru, TaN, CuN, TaCuN, and/or CoFeX where X is Cr, Rh, Ru, TaN, CuN, and TaCuN.

10. The magnetic element of claim 1 wherein the free layer includes a plurality of bilayers, each of the plurality of bilayers includes a $Fe_xCo_{1-x}$ and a Cu layer, x less than one.

11. A magnetic element comprising:
a first pinned layer;
a spacer layer, the spacer layer being conductive and nonmagnetic;
a free layer having a free layer magnetization, the spacer layer residing between the first pinned layer and the free layer, the free layer being a low saturation magnetization free layer;
a barrier layer, the barrier layer being an insulator and having a thickness that allows tunneling through the barrier layer;
a second pinned layer, the barrier layer being between the free layer and the second pinned layer;
wherein the magnetic element is configured to allow the free layer magnetization to be switched due to spin transfer when a write current is passed through the magnetic element.

12. The magnetic element of claim 11 wherein the free layer includes at least one ferromagnetic material diluted with at least one nonmagnetic material.

13. The magnetic element of claim 11 wherein the free layer includes CoX, FeX, CoFeX, NiFeX, CoXY, FeXY, CoFeXY, NiFeXY, and/or CoNiFeXY where X or Y is Cr, Cu, Au, B, Nb, Mo, Pt, Pd, Ta, Rh, Ru, Ag, TaN, CuN, and/or TaCuN.

14. The magnetic element of claim 11 wherein the free layer includes a multilayer including at least one ferromagnetic layer and at least one nonmagnetic layer.

15. The magnetic element of claim 14 wherein the free layer includes a plurality of bilayers, each of the plurality of bilayers includes a $Fe_xCo_{1-x}$ and a Cu layer, x less than one.

16. The magnetic element of claim 15 wherein x is 0.5.

17. The magnetic element of claim 15 wherein the Cu or FeCo layer is greater than or equal to one Angstrom and less than or equal to eight Angstroms in thickness.

18. The magnetic element of claim 11 wherein the free layer includes at least one ferromagnetic material ferrimagnetically doped with at least one dopant.

19. The magnetic element of claim 18 wherein the free layer includes CoX, FeX, CoFeX, NiFeX, and/or CoNiFeX where X includes at least one rare earth element.

20. The magnetic element of claim 19 wherein the at least one rare earth element is Gd or Tb.

21. The magnetic element of claim 20 wherein the free layer further includes at least one additional dopant, the at least one additional dopant including Cr, Cu, Au, Nb, Mo, Pt, Pd, Ta, Rh, and/or Ru.

22. The magnetic element of claim 11 further comprising:
a high spin polarization layer residing between the free layer and the spacer layer.

23. The magnetic element of claim 11 wherein the pinned layer includes a plurality of bilayers, each of the plurality of bilayers includes a $Fe_xCo_{1-x}$ and a Cu layer, x less than one.

24. The magnetic element of claim 11 wherein the free layer is a simple free layer.

25. The magnetic element of claim 11 wherein the first pinned layer is a first synthetic pinned layer including a ferromagnetic layer adjacent to the spacer layer, wherein the ferromagnetic layer has a first magnetization and the second pinned layer has a second magnetization and wherein the first magnetization and the second magnetization are oriented in opposite directions.

26. The magnetic element of claim 25 wherein the second pinned layer is a second synthetic pinned layer.

27. The magnetic element of claim 26 wherein the wherein the second synthetic pinned layer includes a second ferromagnetic layer adjacent to the barrier layer, wherein the second ferromagnetic layer has a second magnetization, and wherein the first magnetization and the second magnetization are oriented in opposite directions.

28. The magnetic element of claim 11 wherein the first pinned layer and the second pinned layer are configured such that charge carriers both from the first pinned layer and from the second pinned layer can contribute to switching of the free layer magnetization due to spin transfer.

29. A magnetic element comprising:
a first pinned layer;
a first spacer layer, the first spacer layer being nonmagnetic;
a first free layer, the first spacer layer residing between the first pinned layer and the first free layer;
a second free layer having a second free layer magnetization, the first free layer and the second free layer being magnetostatically coupled;

a second spacer layer being nonmagnetic;

a second pinned layer, the second spacer layer residing between the second free layer and the second pinned layer;

wherein the magnetic element is configured to allow the free layer magnetization to be switched due to spin transfer when a write current is passed through the magnetic element; and wherein the first free layer is configured to have a first low saturation magnetization and/or the second free layer is configured to have a second low saturation magnetization.

30. The magnetic element of claim 29 further comprising:

a separation layer residing between the first free layer and the second free layer, the separation layer being configured to allow the first free layer and the second free layer to be magnetostatically coupled.

31. The magnetic element of claim 30 wherein the separation layer further includes Cu, Ag, Au, Pt, Mn, CuPt, CuMn, a Cu/Pt/Cu sandwich, a Cu/Mn/Cu sandwich, or a Cu/PtMn[1-20A]/Cu sandwich.

32. The magnetic element of claim 29 wherein the first free layer and/or the second free layer includes at least one ferromagnetic material diluted with at least one nonmagnetic material.

33. The magnetic element of claim 32 wherein the first free layer and/or the second free layer includes CoX, FeX, CoFeX, NiFeX, CoXY, FeXY, CoFeXY, NiFeXY, and/or CoNiFeXY where X or Y is Cr, Cu, Au, B, Nb, Mo, Pt, Pd, Ta, Rh, Ru, Ag, TaN, CuN, and/or TaCuN.

34. The magnetic element of claim 33 wherein X and Y are at least five atomic percent and less than or equal to sixty atomic percent for Cr, Cu, Au, B, Nb, Mo, Ta, Rh, Ru, Ag, TaN, CuN, and/or TaCuN and at least five atomic percent and less than or equal to eighty percent for Pt and Pd.

35. The magnetic element of claim 29 wherein the first free layer and/or the second free layer includes a multilayer including at least one ferromagnetic layer and at least one nonmagnetic layer.

36. The magnetic element of claim 35 wherein the first free layer and/or the second free layer includes a plurality of bilayers, each of the plurality of bilayers includes a $Fe_xCo_{1-x}$ and a Cu layer, x less than one.

37. The magnetic element of claim 36 wherein x is 0.5.

38. The magnetic element of claim 37 wherein the Cu or FeCo layer is greater than or equal to one Angstrom and less than or equal to eight Angstroms in thickness.

39. The magnetic element of claim 29 wherein the first free layer and/or the second free layer includes at least one ferromagnetic material ferrimagnetically doped with at least one dopdant.

40. The magnetic element of claim 39 wherein the first free layer and/or the second free layer includes CoX, FeX, CoFeX, NiFeX, and/or NiCoFeX where X includes at least one rare earth element in a range of five to sixty atomic percent.

41. The magnetic element of claim 40 wherein the at least one rare earth element is Gd or Tb from five to sixty atomic percent.

42. The magnetic element of claim 40 wherein the first free layer and/or the second free layer further includes at least one additional dopant, the at least one additional dopant including Cr, Cu, Au, Nb, Mo, Pt, Pd, Ta, Rh, or Ru.

43. The magnetic element of claim 40 wherein the second spacer layer is a barrier layer, the barrier layer being configured to allow charge carriers to tunnel between the second pinned layer and the second free layer.

44. The magnetic element of claim 40 further comprising:

a high spin polarization layer residing between the first free layer and the first spacer layer and/or between the second spacer layer and the second free layer.

45. The magnetic element of claim 29 wherein the first pinned layer and/or the second pinned layer includes a plurality of bilayers, each of the plurality of bilayers includes a $Fe_xCo_{1-x}$ and a Cu layer, x less than one.

46. A method for providing magnetic element comprising:

providing a pinned layer;

providing a spacer layer, the spacer layer being nonmagnetic; and providing a free layer having a free layer magnetization, the spacer layer residing between the pinned layer and the free layer, the free layer including at least one ferromagnetic material that is diluted with at least one nonmagnetic material and/or ferrimagnetically doped such that the free layer has a low saturation magnetization;

wherein if the free layer includes the at least one ferromagnetic material that is diluted with the at least one nonmagnetic material, then the free layer includes at least CoX, FeX, NiFeX, CoXY, FeXY, CoFeXY, NiFeXY, and/or CoNiFeXY where X or Y is Cr, Cu, Au, B, Nb, Mo, Pt, Pd, Ta, Rh, Ru, Ag, TaN, CuN, TaCuN and/or CoFeX where X is Cr, Cu, Au, Nb, Mo, Pt, Pd, Ta, Rh, Ru, Ag, TaN, CuN, and TaCuN;

wherein the magnetic element is configured to allow the free layer magnetization to be switched due to spin transfer when a write current is passed through the magnetic element.

* * * * *